US008324957B2

(12) United States Patent
Thomas et al.

(10) Patent No.: US 8,324,957 B2
(45) Date of Patent: Dec. 4, 2012

(54) CAPACITIVELY COUPLED SWITCHED CURRENT SOURCE

(75) Inventors: David Thomas, Colorado Springs, CO (US); Richard Reay, Mountain View, CA (US)

(73) Assignee: Linear Technology Corporation, Milpitas, CA (US)

( * ) Notice: Subject to any disclaimer, the term of this patent is extended or adjusted under 35 U.S.C. 154(b) by 52 days.

(21) Appl. No.: 12/949,722

(22) Filed: Nov. 18, 2010

(65) Prior Publication Data

US 2012/0013389 A1 Jan. 19, 2012

Related U.S. Application Data

(60) Provisional application No. 61/365,006, filed on Jul. 16, 2010.

(51) Int. Cl.
*H03K 17/04* (2006.01)
*H03K 17/687* (2006.01)

(52) U.S. Cl. ......................... 327/375; 327/112; 327/434

(58) Field of Classification Search ........................ None
See application file for complete search history.

(56) References Cited

U.S. PATENT DOCUMENTS 5,166,630 A 11/1992 Lee
5,936,434 A * 8/1999 Kumamoto et al. ............ 327/77
6,094,087 A * 7/2000 He et al. ........................ 327/434
6,462,695 B1 10/2002 Ahuja et al.
6,529,536 B1 * 3/2003 Taguchi ..................... 372/38.07
6,653,886 B1 11/2003 Lee et al.
6,831,498 B2 12/2004 Marsh
6,958,631 B2 10/2005 Aiba et al.
7,292,075 B2 * 11/2007 Abdel-Hamid et al. ...... 327/111
7,425,846 B2 * 9/2008 Kim ................................ 326/84

OTHER PUBLICATIONS

Dan B Kasha et al., "A 16-mW, 120-dB Linear Switched-Capacitor Delta-Sigma Modulator with Dynamic Biasing," IEEE Journal of Solid State Circuits, vol. 34, No. 7, Jul. 1999, pp. 921-926.

* cited by examiner

*Primary Examiner* — Lincoln Donovan
*Assistant Examiner* — Terry L Englund
(74) *Attorney, Agent, or Firm* — Patent Law Group LLP; Brian D. Ogonowsky

(57) ABSTRACT

A current source is switchable between two precisely defined output currents. A terminal of a coupling capacitor is coupled to the gate of an output MOSFET. The other terminal of the capacitor is switched between two reference voltages to toggle the output MOSFET to output the selected one of the two currents. A switchable bias voltage source is coupled to the gate only during the on state of the output MOSFET to set the gate voltage of the output MOSFET. The current output of the current source is quickly and accurately changed. A reference MOSFET is not directly coupled to the output MOSFET, so there are no slow settling components coupled to the gate of the output MOSFET.

20 Claims, 2 Drawing Sheets

CAPACITIVELY COUPLED SWITCHED CURRENT SOURCE

CROSS-REFERENCE TO RELATED APPLICATIONS

This application is based on and claims the benefit of U.S. Provisional Application No. 61/365,006, filed on Jul. 16, 2010, entitled Capacitively Coupled Switch Current Source, by David Thomas and Richard Reay, incorporated herein by reference.

FIELD OF THE INVENTION

This invention relates to current sources and, in particular, to current sources that switch between two output currents.

BACKGROUND

In many applications, it is necessary to quickly change the output current of a current source. Ideally, the current would instantly change between two values. In a practical circuit, the current will exhibit undue settling delay; it will transition most of the way to its new value fairly quickly but take much longer to completely settle to the final value. This slowly settling error term is typically due to a reference transistor being disturbed by the switching. For example, after switching between output currents, the final current through a reference MOSFET in a current mirror will be delayed due to the time required to charge the relatively large gate capacitance of the output MOSFET. Many examples of switched current sources have been described in the prior art.

FIG. 1 shows one prior art method for switching between two current levels. MOSFETs M1 and M2 are connected as a current mirror, where the current through MOSFET M2 is controlled by the current through MOSFET M1. MOSFET M2 will typically be much larger (have a wider gate) than MOSFET M1, so the currents will be proportional to their respective sizes. The current source I1 is permanently connected to the drain of MOSFET M1, and the current source I2 is selectively connected to the drain via a switch 10. When clock signal PHI is high, the switch 10 is closed and the input of the M1/M2 current mirror is I1+I2. When PHI is low, the current drops to I1. As the drain current of MOSFET M1 changes, its gate to source voltage will be slow to react since MOSFET M2 is usually much larger than MOSFET M1 and has a large gate capacitance. A slowly changing gate voltage on the M1/M2 current source results in slow settling of IOUT through MOSFET M2.

FIGS. 2 and 3 show slightly faster methods for switching current, since the switching by the clock signal PHI has less effect on the gate voltage of the current mirror reference MOSFET M3 (FIG. 2) and MOSFET M7 (FIG. 3).

In FIGS. 2 and 3, the input to MOSFET M3 (FIG. 2) and MOSFET M7 (FIG. 3) stays constant, and the current mirror output is split into two branches: one that is always on and one that is completely switched on or off. MOSFETs M3 and M7 will be referred to as reference MOSFETs. The "always on" branches include MOSFET M4 in FIG. 2 and MOSFETs M9 and M10 in FIG. 3. The switched branches include MOSFETs M5 and M6 in FIG. 2 and MOSFETs M11 and M12 in FIG. 3.

In the circuits of FIGS. 2 and 3, the switching transient at the gates of the reference MOSFETs M3 and M7 is smaller than in FIG. 1, but there will still be a disturbance coupled through the gate capacitance of MOSFETs M5 and M11.

A further disadvantage of these circuits is that they require extra voltage headroom since there is a second MOSFET in series with the output MOSFET M5 and M12.

What is needed is a current source that can more quickly and accurately change its current output.

SUMMARY

This invention is a method for quickly and accurately changing the current output of a current source so that the current source may, for example, generate a precise current square wave. By coupling only switches and capacitors to the gate of the current source output transistor, the slow settling components common in prior art circuits are avoided.

In one embodiment, the capacitive gate of the current source output MOSFET is connected to a bias circuit (generating VBIAS) and to one end of a coupling capacitor C1. The other end of the capacitor C1 is connected to a switching circuit that applies either a reference voltage VREF or ground to the capacitor to turn the MOSFET on and off or control the MOSFET to output any two currents. The capacitance seen at the gate is represented by a capacitor C2.

As the switching circuit is toggled, a square wave signal will appear at the gate of the MOSFET equal to either VBIAS or VBIAS−[VREF*C1/(C1+C2)]. The sizes of capacitors C1 and C2, in conjunction with the bias voltage, set the high and low values of the MOSFET's drain current. Accordingly, the output MOSFET's gate capacitance is taken into account in setting the gate voltage needed to turn off the MOSFET. C2 can be just the gate capacitance of the MOSFET, or it can also be increased by adding an extra capacitor to ground.

In one embodiment, the bias circuit comprises a reference MOSFET with its drain connected to a current source. The reference MOSFET is a selected fraction of the size of the output MOSFET. The gate of the reference MOSFET is connected to its drain so that the gate voltage generated is that needed to pass the current through the reference MOSFET. The reference MOSFET and output MOSFET are designed to have currents that are a precise ratio. A switch connects the gate of the reference MOSFET to a small bias capacitor when the output MOSFET is off to charge the bias capacitor to VBIAS. A number of clock cycles is typically needed to fully charge the bias capacitor until a steady state condition is reached. When the bias capacitor is connected to the gate of the reference MOSFET, it is disconnected from the gate of the output MOSFET. When the output MOSFET is to be turned on, the bias capacitor is disconnected from the reference MOSFET and connected to the gate of the output MOSFET to apply the VBIAS voltage to the gate of the output MOSFET to turn it on.

Also, during the output MOSFET on state, VREF is coupled to the capacitor C1. When the output MOSFET is to be turned off, the bias capacitor is decoupled from the output MOSFET, VREF is decoupled from capacitor C1, and capacitor C1 is connected to ground. This causes the voltage VBIAS−[VREF*C1/(C1+C2)] to be applied to the gate of the output MOSFET to turn it off, since the voltage is designed to be below the threshold voltage of the output MOSFET. VREF, C1, and C2 do not affect the gate voltage of the output MOSFET in its on state.

As seen, the reference MOSFET is disconnected from the output MOSFET during the time the output MOSFET is turning on. Since there is no reference MOSFET that is affected by the switching on of the current source, there are no reference MOSFET transients that affect the output current, and the output current settles very quickly. Any RC switching delay is very small compared to the delay in the prior art current sources.

BRIEF DESCRIPTION OF THE DRAWINGS

Elements that are the same or equivalent are labeled with the same numeral.

DETAILED DESCRIPTION

Figure 1:
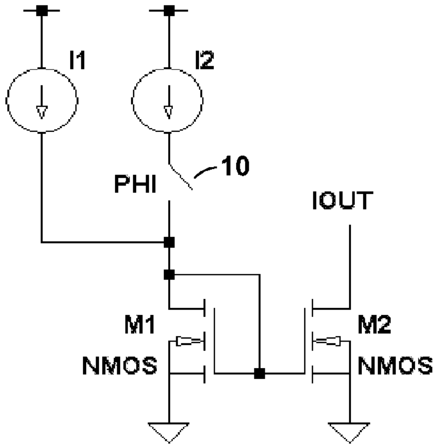
Fig. 1 (prior art)
FIG. 1 is a schematic of a first type of prior art current source.
Figure 2:
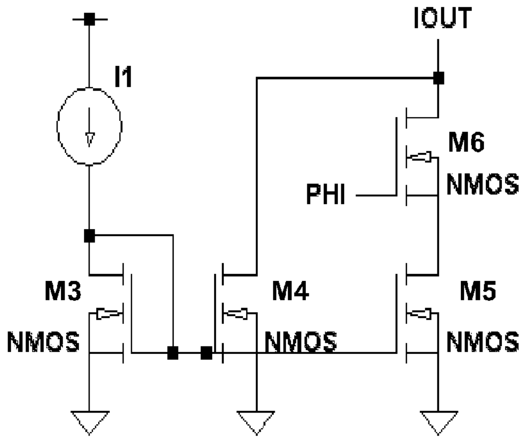
Fig. 2 (prior art)
FIG. 2 is a schematic of a second type of prior art current source.
Figure 3:
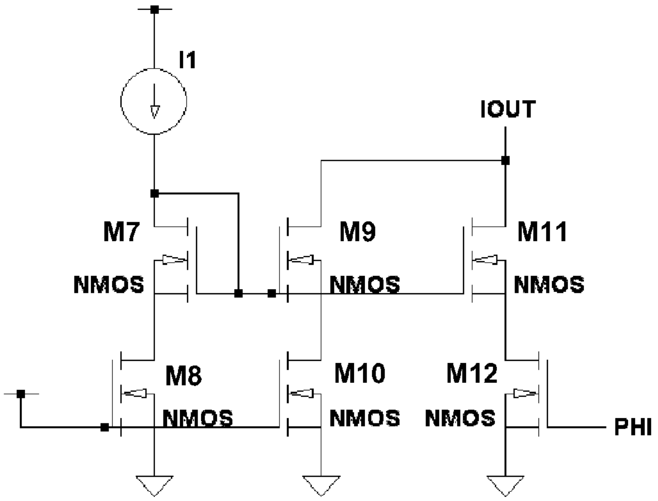
Fig. 3 (prior art)
FIG. 3 is a schematic of a third type of prior art current source.
Figure 4:
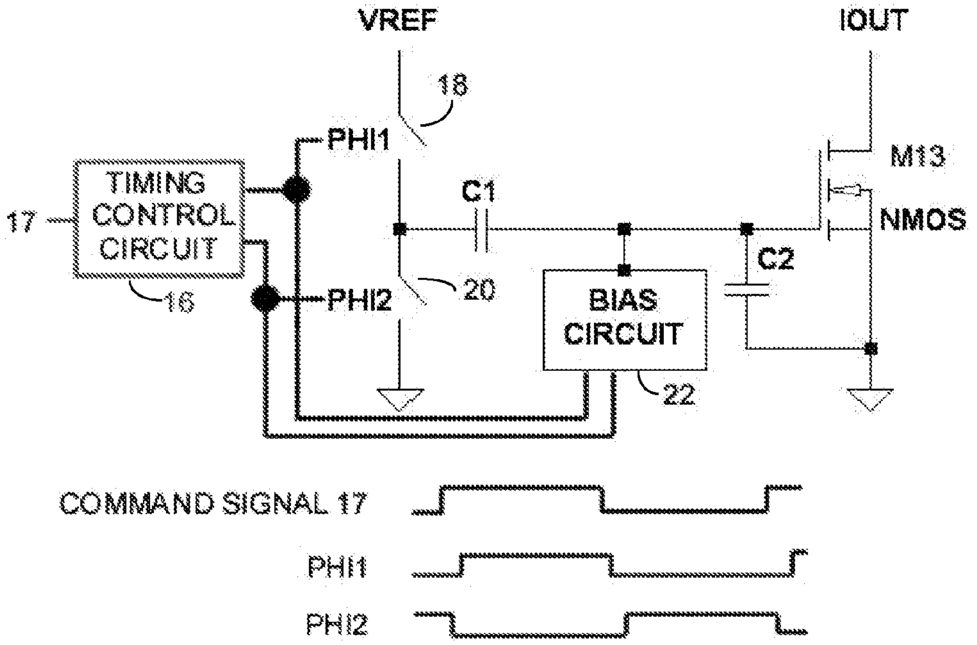
FIG. 4 is a schematic of a current source in accordance with one embodiment of the invention.

FIG. 4 illustrates one embodiment of a current source in accordance with the invention.

To switch the output MOSFET M13 between two values, such as to generate a current square wave, a coupling capacitor C1 is switched between ground and a low impedance reference voltage VREF by non-overlapping clock signals PHI1 and PHI2. The switches 18 and 20 may be any fast transistor switches, including MOSFETs and transmission gates. The clock signals PHI1 and PHI2 are generated by a timing control circuit 16 in response to an external command signal 17. Examples of the command signal 17 and clock signals are shown in FIG. 4.

The timing control circuit 16 causes the PHI1 high level transition to occur after the PHI2 low level transition to ensure that switch 20 is substantially off prior to switch 18 turning on to prevent shoot-through current. Similarly, the PHI1 low level transition occurs before the PHI2 high level transition to ensure that switch 18 is substantially off prior to switch 20 turning on.

A square wave signal will appear at the gate of MOSFET M13 equal to VBIAS (to turn on) or VBIAS−[VREF*C1/(C1+C2)] (to turn off), where C2 is the total capacitance seen at the gate of MOSFET M13. The various values are chosen to set the high and low values of the MOSFET M13 drain current. C2 can be just the gate capacitance of MOSFET M13, or it can also be increased by adding an extra capacitor to ground.

The VREF source preferably has a low impedance. Therefore, any RC switching delay will be very small.

The bias circuit 22 sets the DC operating point of MOSFET M13 so MOSFET M13 conducts the desired current at the two states. One possible implementation of the bias circuit 22 is shown in FIG. 5.

Figure 5:
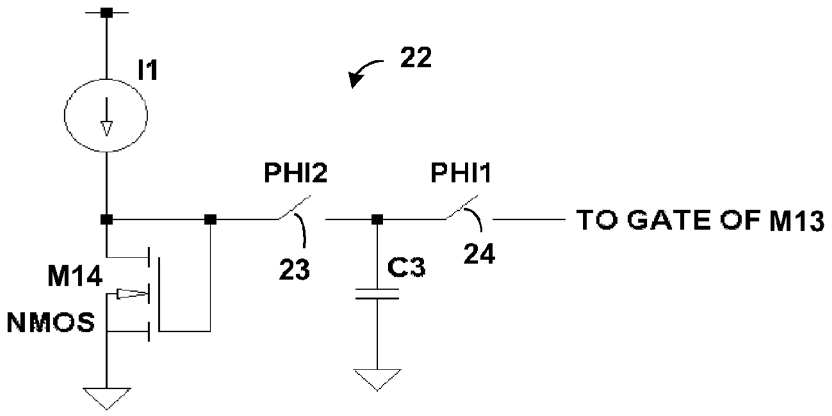
FIG. 5 is a schematic of a bias circuit that can be used in the current source of FIG. 4.

In FIG. 5, a switch 23 is controlled by PHI2 to couple a small bias capacitor C3 to the gate of a reference MOSFET M14 during the time that MOSFET M13 is off. The gate of MOSFET M14 is connected to its drain. A current source I1 outputs a current that is conducted by MOSFET M14 at a certain gate voltage. The current source I1 and MOSFET M14 are selected to cause the MOSFET M14 gate voltage to be VBIAS, which is the desired gate voltage of MOSFET M13 in its on state. Therefore, when switch 23 is on, capacitor C3 is quickly charged to the gate voltage of reference MOSFET M14. (Upon the bias circuit 22 being initially powered up, it will take multiple cycles for the bias capacitor C3 to substantially charge to the MOSFET M14 gate voltage from a zero charge state.) MOSFET M14 is a selected fraction of the size of the output MOSFET M13 so that their currents are a precise ratio.

When PHI2 goes low and PHI1 goes high, capacitor C3 is then disconnected from MOSFET M14 and connected to the gate of MOSFET M13 through switch 24 to couple VBIAS to the gate of MOSFET M13. The clock signals PHI1 and PHI2 in FIG. 5 are the same as clock signals PHI1 and PHI2 in FIG. 4. At the same time that capacitor C3 is connected to MOSFET M13, VREF is coupled to capacitor C1 via the switch 18 in FIG. 4. VREF does not affect the operation of MOSFET M13 when MOSFET M13 is in its on state. Capacitor C3 will maintain the gate of MOSFET M13 at VBIAS during the entire time that MOSFET M13 is to be on.

When PHI1 goes low and PHI2 goes high, switches 23 and 24 reverse to decouple capacitor C3 from the gate of MOSFET M13. Similarly, switches 18 and 20 in FIG. 4 reverse so that capacitor C1 is connected to ground. This pulls down the gate of MOSFET M13 to VBIAS−[VREF*C1/(C1+C2)] to turn MOSFET M13 off. VREF, C1, and C2 are selected to ensure that the gate voltage to MOSFET M13 is below the threshold voltage in the off state. While switch 23 is on, the bias capacitor C3 again charges to the gate voltage of the reference MOSFET M14.

As seen, the reference MOSFET M14 is completely decoupled from the output MOSFET M14 when MOSFET M13 is turning on.

Accordingly, upon the generation of a high PHI1 signal, the MOSFET M13 gate is charged extremely quickly to a steady state target voltage for generating a desired current without being influenced by any transient operation of a reference MOSFET.

In an alternate embodiment, a fixed bias voltage source may be connected to the gate of MOSFET M13 by a high value resistor to act as a weak pull up source. However, the circuit of FIG. 5 will provide more accurate and faster operation.

If the VREF source has a low output impedance and settles quickly, then IOUT will also settle quickly since there are no high-impedance, slow settling nodes in the circuit of FIG. 4. Other circuits in the system may already have such a VREF source that can be used. If a low impedance VREF source is not available, then the circuit of FIG. 6 can be used as the voltage source.

Figure 6:
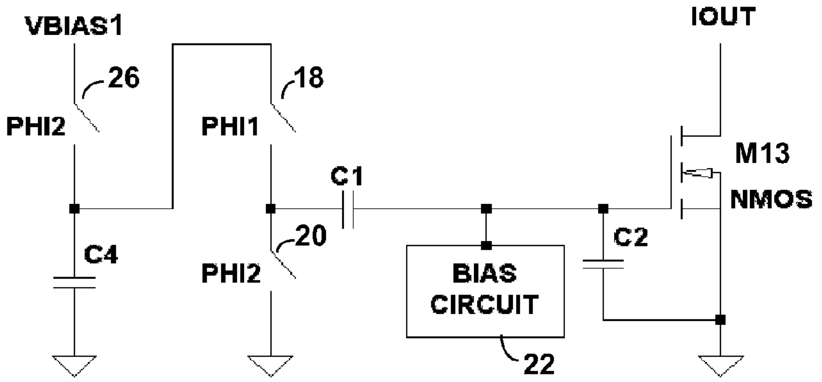
FIG. 6 is a schematic of the current source of FIG. 4 but having a switching circuit that can be used with higher impedance VREF sources.

In FIG. 6, during phase PHI2 (the low output current phase), when the switch 26 is closed, capacitor C4 is charged to a bias voltage VBIAS1. During phase PHI1, capacitor C4 is connected to the left side of capacitor C1 by switch 18, and the charge stored on capacitor C4 quickly redistributes on capacitors C1 and C2, pulling up the gate voltage of MOSFET M13. This circuit is very fast because only switches and capacitors are coupled to the gate of the output MOSFET M13, avoiding the slow settling components common in prior art circuits. The clock signals PHI1 and PHI2 in FIG. 6 are the same as clock signals PHI1 and PHI2 in FIG. 4.

Although the low reference voltage in the examples has been ground to turn MOSFET M13 off (substantially no current generated), the low reference voltage may be any other voltage to set the low current state of MOSFET M13 to any positive current level. Effectively, the current source circuit determines the two levels of conductivity of the output MOSFET, where the conductivity determines the output current. The conductivity is substantially zero in the MOSFET's off state.

The invention also applies to a current source using bipolar transistors instead of MOSFETs.

Accordingly, while particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. A current source comprising:

an output MOSFET having a gate, the output MOSFET being controlled to have two different conductivity states for generating different currents;

a first terminal of a first capacitor, having a first capacitance, coupled to the gate;

a bias voltage source selectively coupled to the gate;

a first switch coupled between a second terminal of the first capacitor and a first reference voltage; and a second switch coupled between the second terminal of the first capacitor and a second reference voltage, the first switch and the second switch being configured to switch oppositely, wherein, when the first switch conducts, the bias voltage source is coupled to the gate and, when the second switch conducts, the bias voltage source is decoupled from the gate, and wherein, when the first switch conducts, the output MOSFET is controlled to have a first conductivity and, when the second switch conducts, the output MOSFET is controlled to have a second conductivity lower than the first conductivity.

2. The current source of claim 1 wherein a second capacitance exists across the output MOSFET, wherein, the first conductivity of the output MOSFET is determined by at least the bias voltage source.

3. The current source of claim 2 wherein the first conductivity is independent of the first reference voltage and the second reference voltage.

4. The current source of claim 3 wherein a bias voltage generated by the bias voltage source is VBIAS, the first reference voltage is VREF1, the first capacitor is C1, and the second capacitance is C2, wherein a gate voltage applied to the output MOSFET when the second switch conducts is approximately VBIAS−[VREF1*C1/(C1+C2)].

5. The current source of claim 4 wherein the second capacitance comprises a parasitic capacitance of the output MOSFET.

6. The current source of claim 1 wherein the bias voltage source comprises:

a first bias voltage source generating a first bias voltage;

a second capacitor having a first terminal connected to ground;

a third switch coupled between the first bias voltage source and a second terminal of the second capacitor, the third switch conducting when the second switch conducts;

a fourth switch coupled between the second terminal of the second capacitor and the gate of the output MOSFET, the fourth switch conducting when the first switch conducts, whereby, when the second switch and third switch are conducting, the second capacitor is coupled to the first bias voltage source and decoupled from the output MOSFET, and when the first switch and fourth switch are conducting, the second capacitor is coupled to the gate of the output MOSFET and decoupled from the first bias voltage source.

7. The current source of claim 6 wherein the first bias voltage source comprises a reference MOSFET having its drain connected to a reference current source and its gate connected to its drain, wherein a gate voltage of the reference MOSFET generates the first bias voltage.

8. The current source of claim 1 further comprising a timing control circuit that receives a master control signal and generates a first control signal for controlling the first switch and generates a second control signal for controlling the second switch to switch opposite to the first switch.

9. The current source of claim 1 wherein the first conductivity causes a first current to be generated by the output MOSFET and wherein the second conductivity causes a second current to be generated by the output MOSFET.

10. The current source of claim 1 wherein the first conductivity causes a first current to be generated by the output MOSFET and wherein the second conductivity is substantially an open circuit to cause substantially zero current to be generated by the output MOSFET.

11. A method of generating a switchable current through an output MOSFET, a first terminal of a first capacitor, having a first capacitance, being connected to a gate of the output MOSFET, the method comprising:

for generating a first current, turning on a first switch coupled between a second terminal of the first capacitor and a first reference voltage, and turning off a second switch coupled between the second terminal of the first capacitor and a second reference voltage, the first switch and the second switch being configured to switch oppositely;

coupling a bias voltage source to the gate when the first switch is on, whereby, when the first switch is turned on, the output MOSFET is controlled to have a first conductivity; and for generating a second current, turning off the first switch and turning on the second switch, while decoupling the bias voltage source from the gate when the first switch is off, whereby, when the first switch is turned off, the output MOSFET is controlled to have a second conductivity, lower than the first conductivity.

12. The method of claim 11 wherein a second capacitance exists across the output MOSFET, wherein, the first conductivity of the output MOSFET is controlled by at least the bias voltage source.

13. The method of claim 12 wherein the first conductivity is independent of the first reference voltage and the second reference voltage.

14. The method of claim 13 wherein a first bias voltage generated by the bias voltage source is VBIAS, the first reference voltage is VREF1, the first capacitor is C1, and the second capacitance is C2, wherein a gate voltage applied to the output MOSFET when the second switch conducts is approximately VBIAS−[VREF1*C1/(C1+C2)].

15. The method of claim 14 wherein the second capacitance comprises a parasitic capacitance of the output MOSFET.

16. The method of claim 11 wherein decoupling the bias voltage source from the gate and coupling the bias voltage source to the gate comprises:

generating a first bias voltage by the bias voltage source;

coupling the first bias voltage to a second capacitor by turning on a third switch, when the second switch is on, to charge the second capacitor to the first bias voltage;

decoupling the second capacitor from the gate by turning off a fourth switch when the second switch is on;

decoupling the first bias voltage from the second capacitor by turning off the third switch, when the second switch is off; and coupling the second capacitor to the gate by turning on the fourth switch when the second switch is off.

17. The method of claim 16 wherein the bias voltage source comprises a reference MOSFET having its drain connected to a reference current source and its gate connected to its drain, wherein a gate voltage of the reference MOSFET generates the first bias voltage.

18. The method of claim 11 further comprising generating a first control signal for controlling the first switch and generating a second control signal for controlling the second switch to switch opposite to the first switch.

19. The method of claim 11 wherein the first conductivity causes a first current to be generated by the output MOSFET and, wherein the second conductivity causes a second current to be generated by the output MOSFET.

20. The method of claim 11 wherein the first conductivity causes a first current to be generated by the output MOSFET and, wherein the second conductivity is substantially an open circuit to cause substantially zero current to be generated by the output MOSFET.

* * * * *